(12) United States Patent
Paek et al.

(10) Patent No.: US 12,477,897 B2
(45) Date of Patent: Nov. 18, 2025

(54) DISPLAY PANEL INCLUDING EXTENDED INORGANIC FILM IN BEZEL REGION

(71) Applicant: LG DISPLAY CO., LTD., Seoul (KR)

(72) Inventors: Seung Han Paek, Paju-si (KR); Juhn Suk Yoo, Paju-si (KR); Kyung Jae Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 693 days.

(21) Appl. No.: 17/864,073

(22) Filed: Jul. 13, 2022

(65) Prior Publication Data

US 2023/0037058 A1 Feb. 2, 2023

(30) Foreign Application Priority Data

Jul. 29, 2021 (KR) .................. 10-2021-0099886

(51) Int. Cl.
*H10K 50/86* (2023.01)
*H10K 59/38* (2023.01)
*H10K 59/40* (2023.01)
*H10K 59/50* (2023.01)
*H10K 59/80* (2023.01)
*G06F 3/044* (2006.01)

(52) U.S. Cl.
CPC ............ *H10K 50/86* (2023.02); *H10K 59/38* (2023.02); *H10K 59/40* (2023.02); *H10K 59/50* (2023.02); *H10K 59/873* (2023.02); *G06F 3/0443* (2019.05)

(58) Field of Classification Search
CPC .. H10K 50/86; H10K 50/844; H10K 50/8426; H10K 50/841; H10K 59/38; H10K 59/40; H10K 59/50; H10K 59/873; H10K 77/10; G06F 3/0443; G06F 3/0412
See application file for complete search history.

(56) References Cited

U.S. PATENT DOCUMENTS

| 10,566,395 | B2 * | 2/2020 | Lee ........................ G06F 3/0443 |
| 2018/0006106 | A1 | 1/2018 | Oh et al. |
| 2018/0348918 | A1 * | 12/2018 | Rhe ........................ G06F 3/0446 |
| 2020/0075692 | A1 * | 3/2020 | Park ...................... H10K 50/844 |
| 2020/0185643 | A1 | 6/2020 | Moon et al. |
| 2020/0203235 | A1 | 6/2020 | Jung et al. |
| 2021/0126224 | A1 | 4/2021 | Lee et al. |
| 2021/0167329 | A1 | 6/2021 | Adachi et al. |
| 2021/0202630 | A1 * | 7/2021 | Jeon .................... H10K 50/844 |
| 2022/0115445 | A1 * | 4/2022 | Ji .......................... H10K 59/122 |

FOREIGN PATENT DOCUMENTS

| KR | 10-2018-0025308 A | 3/2018 |
| KR | 10-2020-0048655 A | 5/2020 |
| KR | 10-2211928 B1 | 2/2021 |
| KR | 20210083004 A * | 7/2021 ............. H10K 59/12 |

* cited by examiner

*Primary Examiner* — Ida M Soward
(74) *Attorney, Agent, or Firm* — Birch, Stewart, Kolasch & Birch, LLP

(57) ABSTRACT

A display panel can include a glass substrate; a circuit layer disposed on the glass substrate; a light-emitting element layer disposed on the circuit layer; an encapsulation layer covering the light-emitting element layer; and a first organic film covering the encapsulation layer, in which the first organic film covers an extended portion of an inorganic film extending from the encapsulation layer in a bezel region of the display panel.

20 Claims, 17 Drawing Sheets

DISPLAY PANEL INCLUDING EXTENDED INORGANIC FILM IN BEZEL REGION

CROSS-REFERENCE TO RELATED APPLICATION

This application claims priority to and the benefit of Korean Patent Application No. 10-2021-0099886, filed in the Republic of Korea on Jul. 29, 2021, the disclosure of which is incorporated herein by reference in its entirety.

BACKGROUND OF THE DISCLOSURE

1. Field

The present disclosure relates to a display panel.

2. Discussion of Related Art

Electroluminescent display devices are roughly classified into inorganic light emitting display devices and organic light emitting display devices according to materials of the light emitting layers. Active matrix type organic light emitting display devices include organic light-emitting diodes (hereinafter referred to as "OLEDs"), which emit light by themselves (e.g., self-emitting), and have fast response speeds and advantages in which light emission efficiencies, brightness, and viewing angles are high. In the organic light-emitting display devices, the OLEDs are formed in pixels. Since the organic light-emitting display devices have fast response speeds and are excellent in light emission efficiency, brightness, and viewing angle as well as being able to exhibit a black gradation in a full black color (e.g., true black), the organic light-emitting display devices are excellent in a contrast ratio and color reproducibility.

The organic light-emitting display devices do not require backlight units and may be implemented on a plastic substrate made of a flexible material, a thin glass substrate, or a metal substrate. Therefore, flexible displays may be implemented as the organic light-emitting display devices.

A screen size of the flexible display may be varied by winding, folding, and bending a flexible display panel. The flexible display may be implemented as a rollable display, a foldable display, a bendable display, a slidable display, or the like. The flexible display may be applied not only to mobile devices, such as smartphones and tablet personal computers (PCs), but also to televisions (TVs), vehicle displays, and wearable devices, and application fields of flexible display devices are expanding.

A great deal of research for reducing a bezel region present at an edge of a display panel is being conducted. A bezel region is a non-display region, in which an image is not displayed, on a display panel. Due to the development of manufacturing process technology, a bezel region of a display panel is becoming smaller.

A display panel may include a plurality of inorganic and organic films. Due to the deformation of or impact on a substrate of the display panel, cracks may propagate inward toward the display panel through a residual inorganic film remaining on a bezel region of the display panel. In order to prevent the crack propagation, structures such as a crack stopper and the like may be formed in the bezel region of the display panel.

A plurality of display panels may be obtained by separating a circuit pattern from a mother substrate in the manufacturing process of the display panel. In the process of separating the circuit pattern from the mother substrate, a laser may irradiate the mother substrate with light. Heat may propagate into the circuit pattern through the inorganic films so that the circuit pattern may be cracked and damaged. In other words, an edge portion of an inorganic film exposed to the outside can become a source of heat conduction/penetration and crack propagation. Since the mother substrate needs a process margin for separating the circuit pattern from the mother substrate and a large enough space, in which a crack stopper is disposed, should be secured, but there is a limit in decreasing the bezel region of the display panel especially when the additional crack stopper is used.

SUMMARY OF THE DISCLOSURE

The present disclosure is directed to solving the above-described necessity and problems.

In particular, the present disclosure is directed to providing a display panel, which is capable of preventing heat and crack propagation while also minimizing the size of a bezel region. Also, embodiments of the present disclosure can better prevent an edge portion of an inorganic film from becoming a source of heat conduction/penetration during manufacture while also minimizing the bezel region.

It should be noted that the present disclosure is not limited to the above-described features, and other features of the present disclosure will be apparent to those skilled in the art from the following descriptions.

According to an aspect of the present disclosure, there is provided a display panel including a circuit layer disposed on a glass substrate, a light-emitting element layer disposed on the circuit layer, an encapsulation layer configured to cover the light-emitting element layer, and an organic film configured to cover the encapsulation layer. The organic film covers an extended portion of an inorganic film extending from the encapsulation layer in a bezel region of the display panel.

According to another aspect of the present disclosure, there is provided a display panel including a circuit layer disposed on a glass substrate, a light-emitting element layer disposed on the circuit layer, an encapsulation layer configured to cover the light-emitting element layer, and an organic film configured to cover the encapsulation layer. A residual inorganic film extending from the encapsulation layer is exposed at a side surface of the display panel exposed to the outside. At the side surface of the display panel, the organic film on the inorganic film is exposed.

According to still another aspect of the present disclosure, there is provided a display panel including a circuit layer disposed on a glass substrate, a light-emitting element layer disposed on the circuit layer, an encapsulation layer configured to cover the light-emitting element layer, and an organic film configured to cover the encapsulation layer. At a side surface of the display panel exposed to the outside, a portion of the organic film that covers a residual inorganic film extending from the encapsulation layer is exposed.

BRIEF DESCRIPTION OF THE DRAWINGS

The above and other objects, features and advantages of the present disclosure will become more apparent to those of ordinary skill in the art by describing example embodiments thereof in detail with reference to the accompanying drawings, in which.

DETAILED DESCRIPTION OF THE EMBODIMENTS

Figure 1:
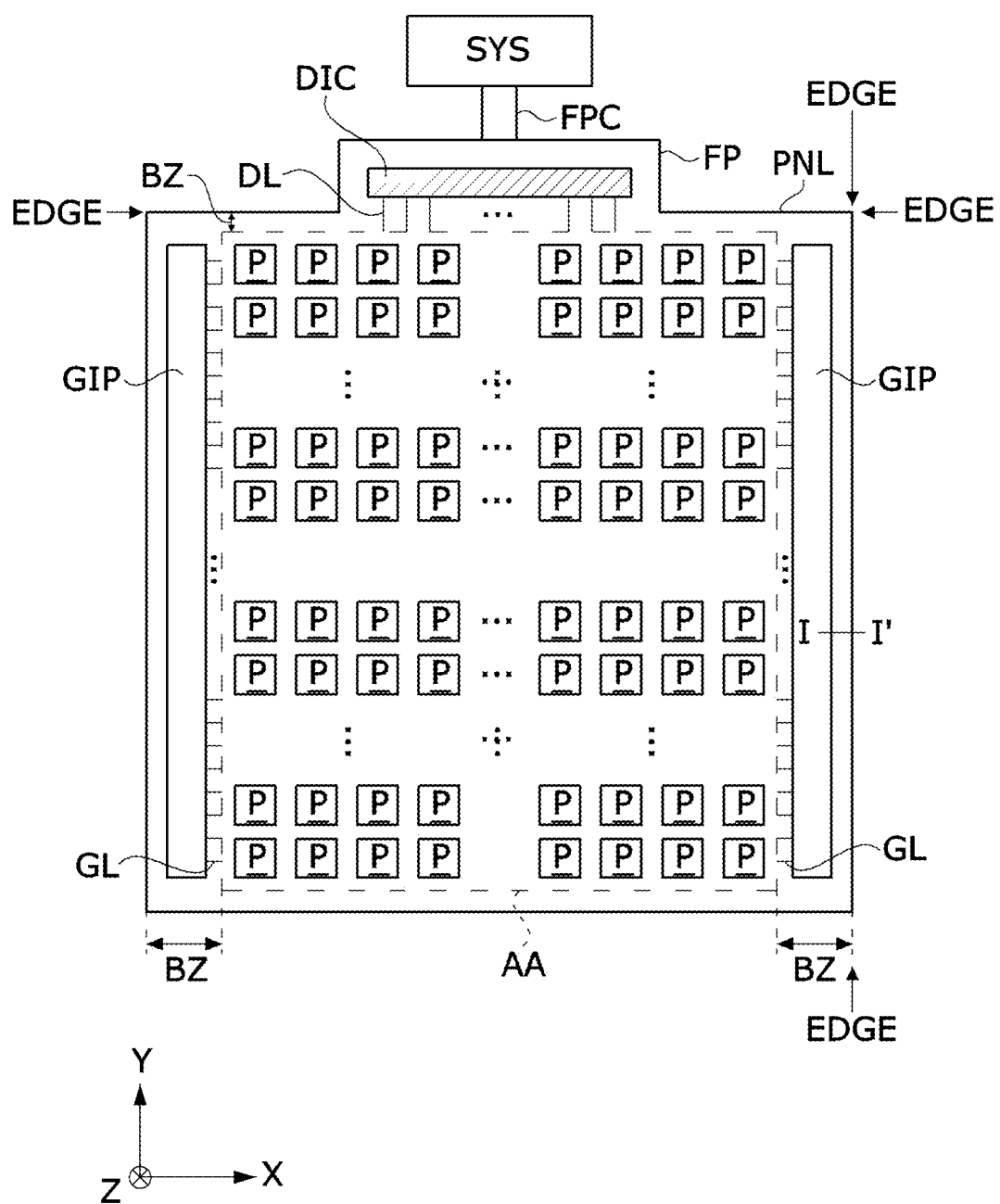
FIGS. 1 and 2 are views illustrating display devices according to embodiments of the present disclosure.

The advantages and features of the present disclosure and methods for accomplishing the same will be more clearly understood from embodiments described below with reference to the accompanying drawings. However, the present disclosure is not limited to the following embodiments but can be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular can include plural unless expressly stated otherwise.

Components are interpreted to include an ordinary error range even if not expressly stated.

When the position relation between two components is described using the terms such as "on," "above," "over," "below," "under," and "next," one or more components can be positioned between the two components unless the terms are used with the term "immediately" or "directly."

The terms "first," "second," and the like can be used to distinguish components from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

In a display device according to embodiments of the present disclosure, the pixel circuit and the gate driving circuit can include a plurality of transistors. Transistors can be implemented as oxide thin film transistors (oxide TFTs) including an oxide semiconductor, low temperature poly-silicon (LTPS) TFTs including low temperature polysilicon, or the like. Each of the transistors can be implemented as a p-channel TFT or an n-channel TFT.

Generally, a transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the situation of an n-channel transistor, since carriers are electrons, a source voltage is a voltage lower than a drain voltage such that electrons can flow from a source to a drain. The n-channel transistor has a direction of a current flowing from the drain to the source. In the situation of a p-channel transistor, since carriers are holes, a source voltage is higher than a drain voltage such that holes can flow from a source to a drain. In the p-channel transistor, since holes flow from the source to the drain, a current flows from the source to the drain. It should be noted that a source and a drain of a transistor are not fixed. For example, a source and a drain can be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage higher than a threshold voltage of a transistor, and the gate-off voltage is set to a voltage lower than the threshold voltage of the transistor.

The transistor is turned on in response to the gate-on voltage and is turned off in response to the gate-off voltage. In the situation of an n-channel transistor, a gate-on voltage can be a gate high voltage VGH and VEH, and a gate-off voltage can be a gate low voltage VGL and VEL. In the situation of the p-channel transistor, the gate-on voltage can be a gate-low voltage VGL and VEL, and the gate-off voltage can be a gate high voltage VGH and VEH.

Hereinafter, various embodiments of the present disclosure will be described in detail with reference to the accompanying drawings.

Figure 2:
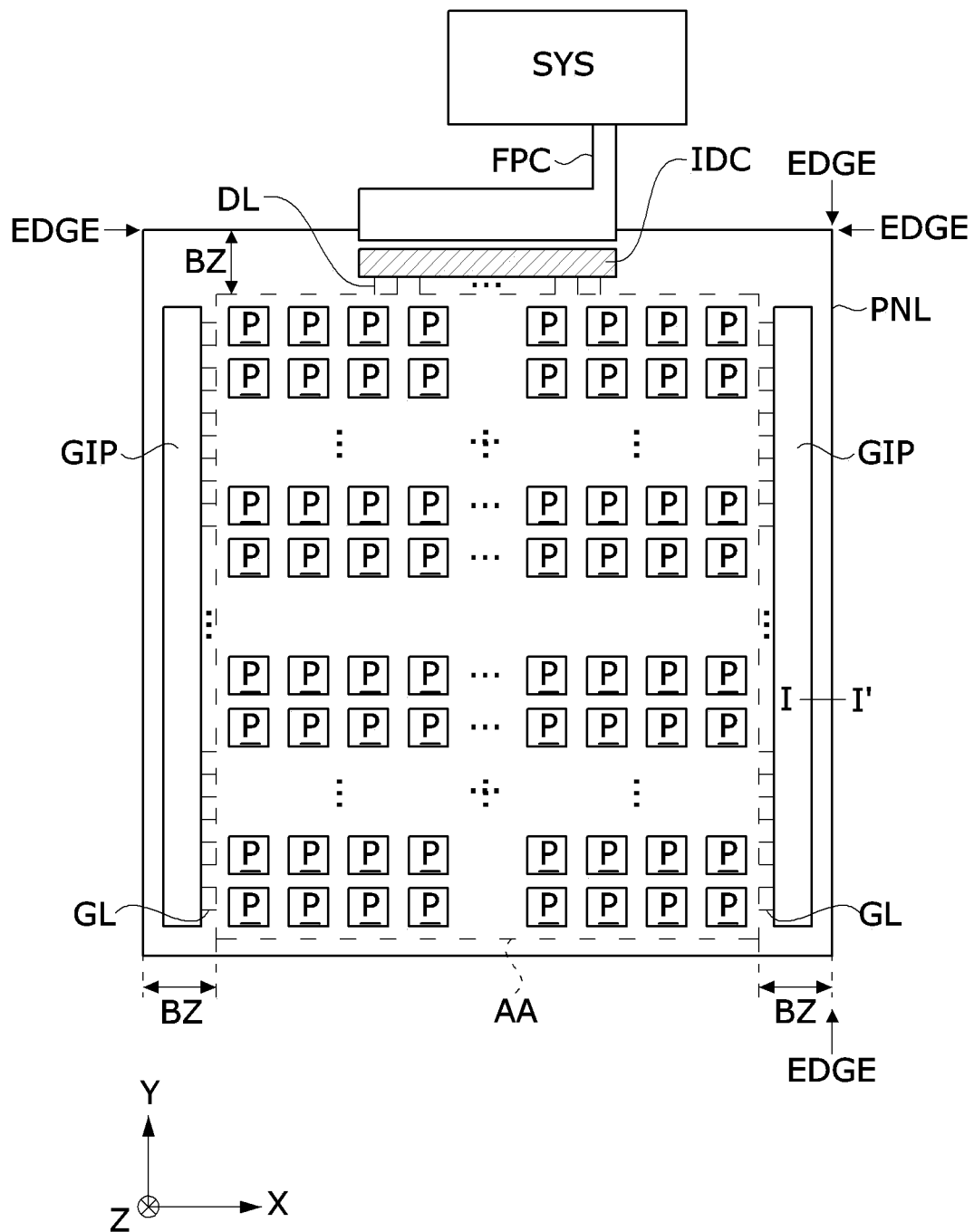

Referring to FIGS. 1 and 2, a display device of the present disclosure includes a display panel PNL in which a pixel array is disposed on a screen, and a display panel driver.

A pixel array AA of the display panel PNL includes data lines DL, gate lines GL crossing the data lines DL, and pixels P which are defined by the data lines DL and the gate lines GL and arranged in a matrix form. The display panel PNL can include a bezel region BZ that is a non-display region outside the pixel array AA.

Each of the pixels P includes subpixels having different colors for color realization. The subpixels include red subpixels (hereinafter, referred to as "R subpixels"), green subpixels (hereinafter, referred to as "G subpixels"), and blue subpixels (hereinafter, referred to as "B subpixels"). In addition, each of the pixels P can further include a white subpixel. For example, a pixel unit can include three or four subpixels. Hereinafter, the pixel can be interpreted as a subpixel unless otherwise defined. Each of the subpixels can include a pixel circuit.

The pixel circuit can include a light-emitting element, a driving element that supplies a current to the light-emitting element, one or more switching elements that switch current paths of the driving element and the light-emitting element, a capacitor that maintains a gate-source voltage Vgs of the driving element, and the like.

The light-emitting element can be implemented as an organic light-emitting diode (OLED). The OLED includes an organic compound layer formed between an anode and a cathode. The organic compound layer can include a hole injection layer (HIL), a hole transport layer (HTL), an emission layer (EML), an electron transport layer (ETL), and an electron injection layer (EIL), but the present disclosure is not limited thereto. When voltages are applied to the anode and the cathode of the OLED, holes passing through the HTL and electrons passing through the ETL are moved to the EML to form excitons, and visible light is emitted from the EML. The OLED, which is used as the light emitting element EL, can have a tandem structure in which a plurality of emitting layers are stacked. The OLED of the tandem structure can improve the luminance and lifespan of pixels.

The display panel driver writes pixel data of an input image in the pixels P. The display panel driver includes a data driver that supplies a data voltage of the pixel data to the data lines DL, and a gate driver GIP that sequentially supplies a gate pulse to the gate lines GL. The data driver is integrated into a drive integrated circuit (IC) DIC. The drive integrated circuit DIC can be adhered onto the display panel PNL.

The drive integrated circuit DIC is connected to the data lines DL through data output channels to supply a voltage of a data signal to the data lines DL. The drive IC DIC includes a timing controller. The timing controller transmits pixel data of an input image received from a host system SYS to the data driver and controls operation timings of the data driver and the gate driver GIP.

The data driver of the drive IC DIC converts the pixel data into a gamma compensation voltage using a digital-to-analog converter (DAC) and outputs the data voltage.

The gate driver GIP can include a shift register which is formed with the pixel array on a circuit layer of the display panel PNL. The shift register of the gate driver GIP supplies gate signals sequentially to the gate lines GL under the control of the timing controller. The gate signal can include a scan pulse and an emission control pulse (hereinafter, referred to as an "EM pulse"). The shift register can include a scan driver that outputs the scan pulse, and an EM driver that outputs the EM pulse.

For example, the host system SYS can be implemented as an application processor (AP). The host system SYS transmits the pixel data of the input image to the drive IC DIC. The host system SYS can be connected to the drive IC DIC through a flexible printed circuit (FPC).

The display panel of the present disclosure may be manufactured based on a thin bendable glass substrate. The glass substrate can be a glass film having a thickness of 0.2 mm or less. The glass film can be used as a commercially available tempered glass film.

The display panel PNL has a width in an X-axis direction, a length in a Y-axis direction, and a constant thickness in a Z-axis direction. Since a circuit layer and a light-emitting element layer are disposed on the glass substrate, the thickness of the display panel PNL is greater than that of the glass substrate. The width and length of the display panel PNL can be set to various design values according to application fields of the display device. The display panel PNL can be manufactured to have a rectangular plate shape, but the present disclosure is not limited thereto. For example, the display panel PNL can be manufactured as a deformable panel including a curved part. When the thickness of the glass substrate of the display panel PNL is small, even a small force can flexibly bend the glass substrate with a sufficiently large curvature.

Figure 3:
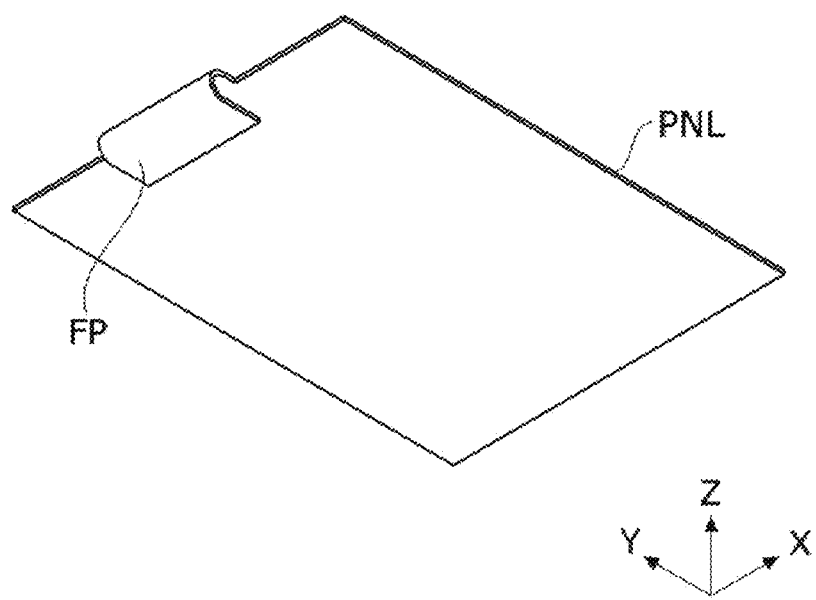
FIGS. 3 to 6 are views illustrating various examples in which a display panel is folded according to embodiments of the present disclosure.

The display panel PNL can include a protruding folding part FP as illustrated in FIGS. 1 and 3. The folding part FP with the drive IC DIC can be folded rearward.

Figure 4:
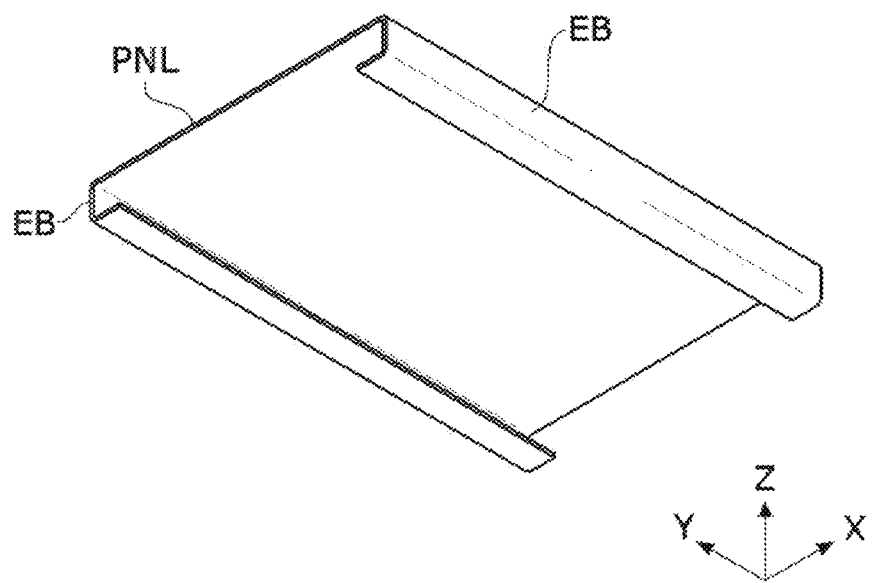
Figure 5:
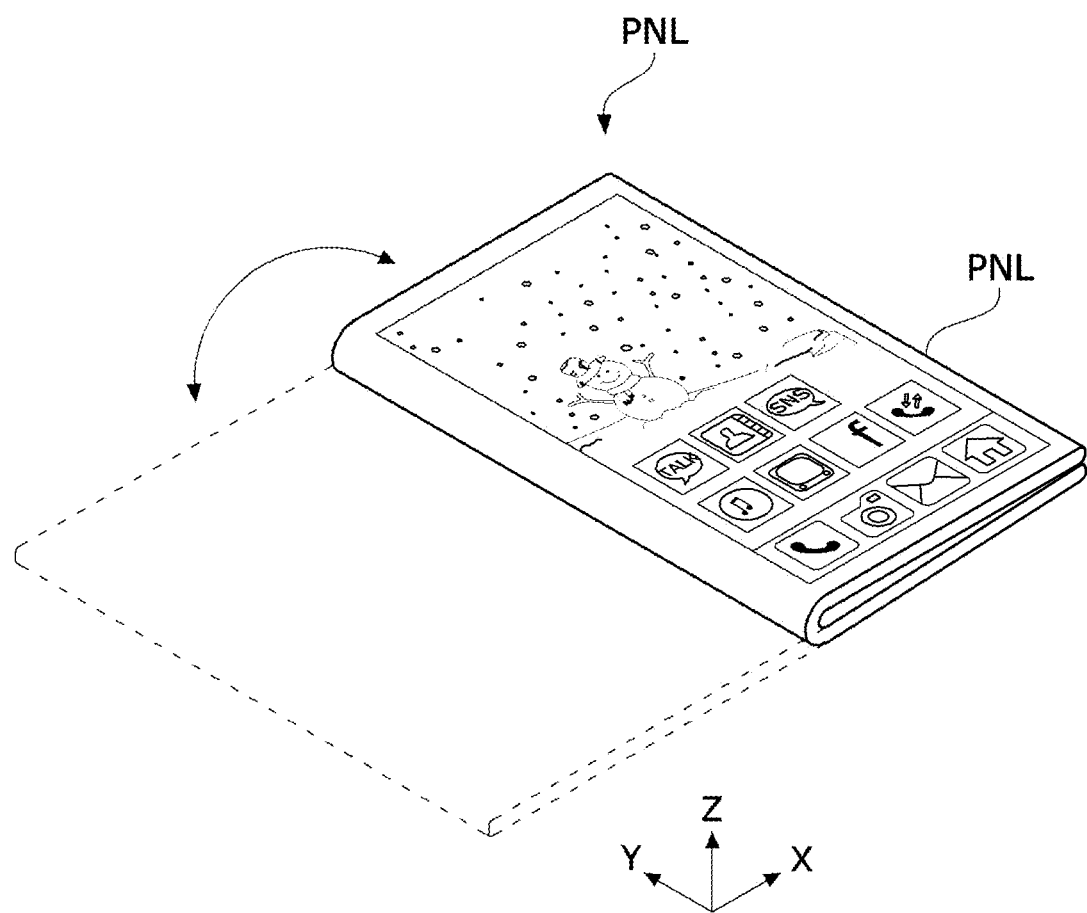
Figure 6:
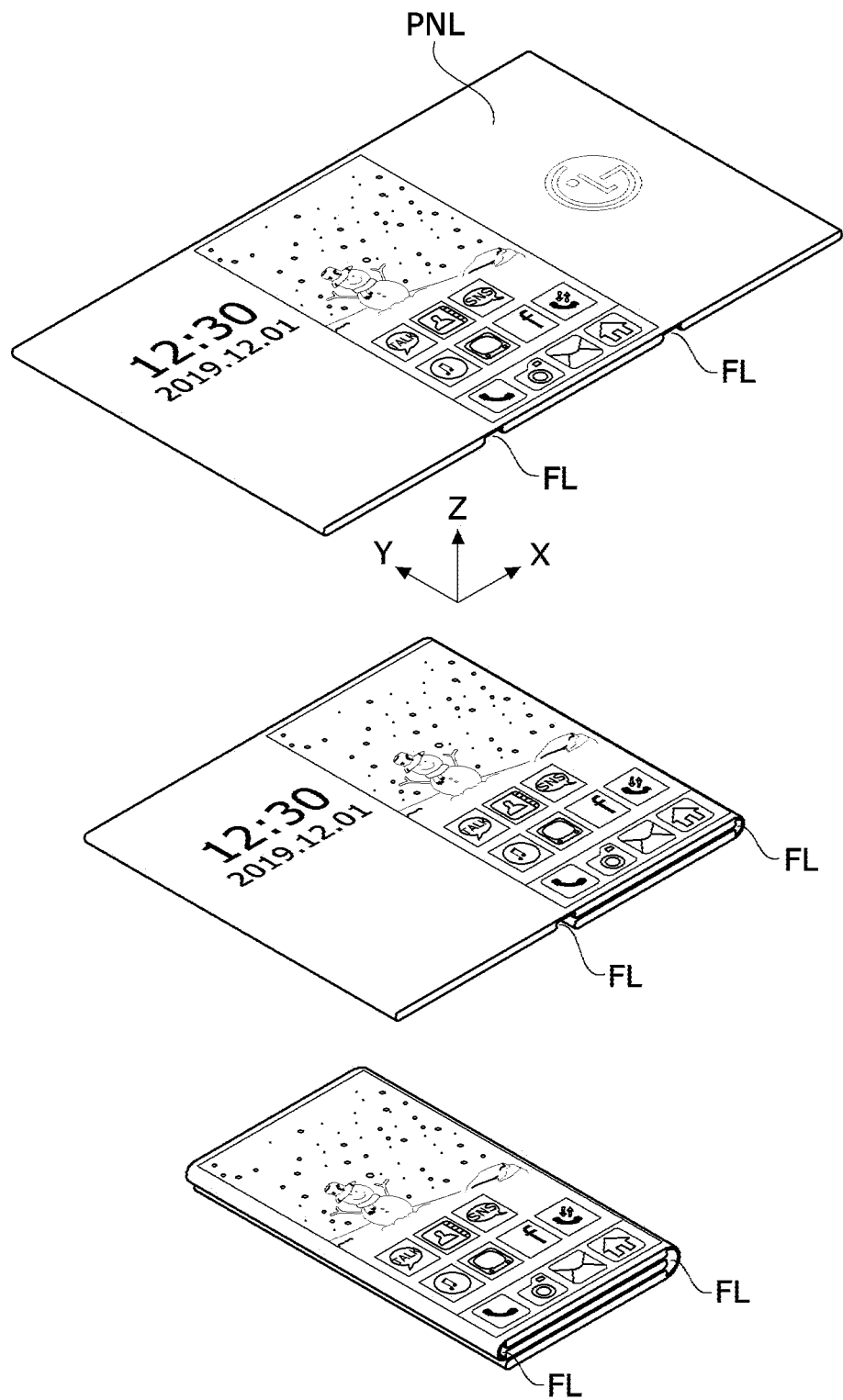

As illustrated in FIG. 4, bezel regions EB at two sides of a display panel PNL, each on which a gate driver GIP is mounted, can be folded. Further, the display panel PNL can be folded one or more times as illustrated in FIGS. 5 and 6. In FIGS. 5 and 6, folding lines FL can overlap a pixel array AA through which an input image is displayed. The glass substrate can be etched at the folding lines FL, and thus a thickness of the folded region can be smaller than that of a non-folded region (e.g., to facilitate folding).

Due to process variation and element characteristic variation caused in the manufacturing process of the display panel, there can be a difference in electrical characteristics of a driving element between subpixels, and the difference can be further increased as a driving time of the pixels elapses. In order to compensate for variations of the electrical characteristics of the driving elements between the pixels, an internal compensation technique or an external compensation technique can be applied to an organic light-emitting display device.

In the internal compensation technique, an internal compensation circuit implemented in each pixel circuit is used to sense a threshold voltage of a driving element for each subpixel, and a gate-source voltage Vgs of the driving element is compensated with the threshold voltage. In the external compensation technique, an external compensation circuit is used to sense a current or voltage of a driving element in real time, which varies according to electrical characteristics of the driving element. In the external compensation technique, by modulating pixel data (digital data) of an input image by the variation (or change) of the electrical characteristic of the driving element sensed for each pixel, the variation (or change) of the electrical characteristic of the driving element is compensated for in real time in each pixel.

Figure 7:
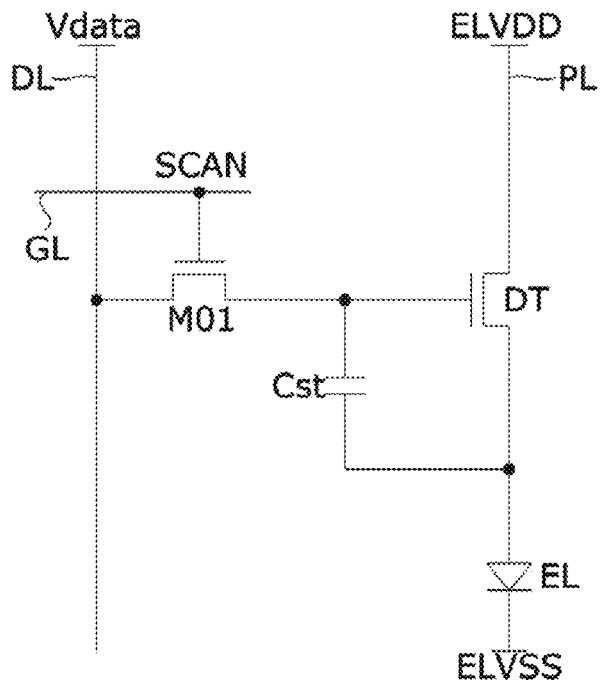
FIGS. 7 to 9 are circuit diagrams illustrating various pixel circuits applicable to a pixel circuit according to embodiments of the present disclosure.
Figure 8:
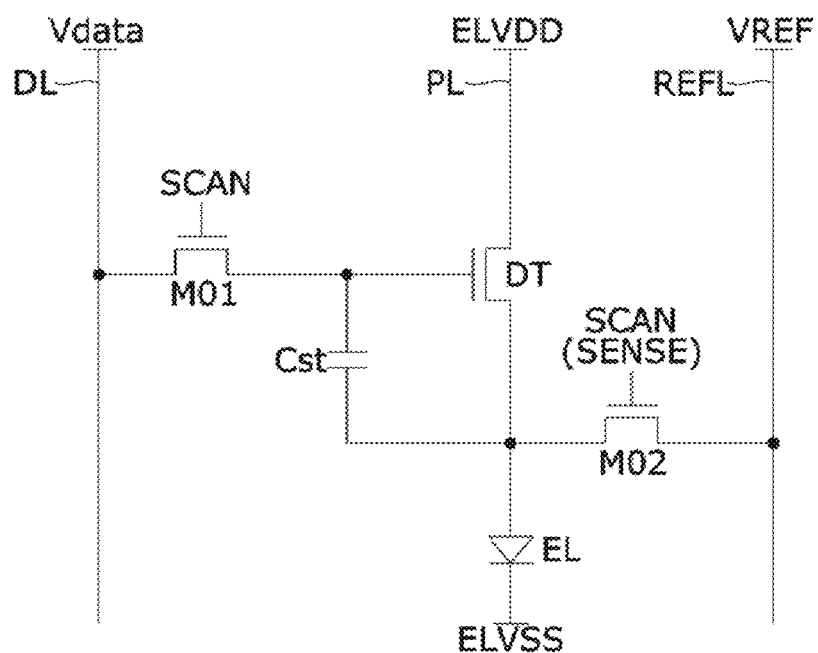
Figure 9:
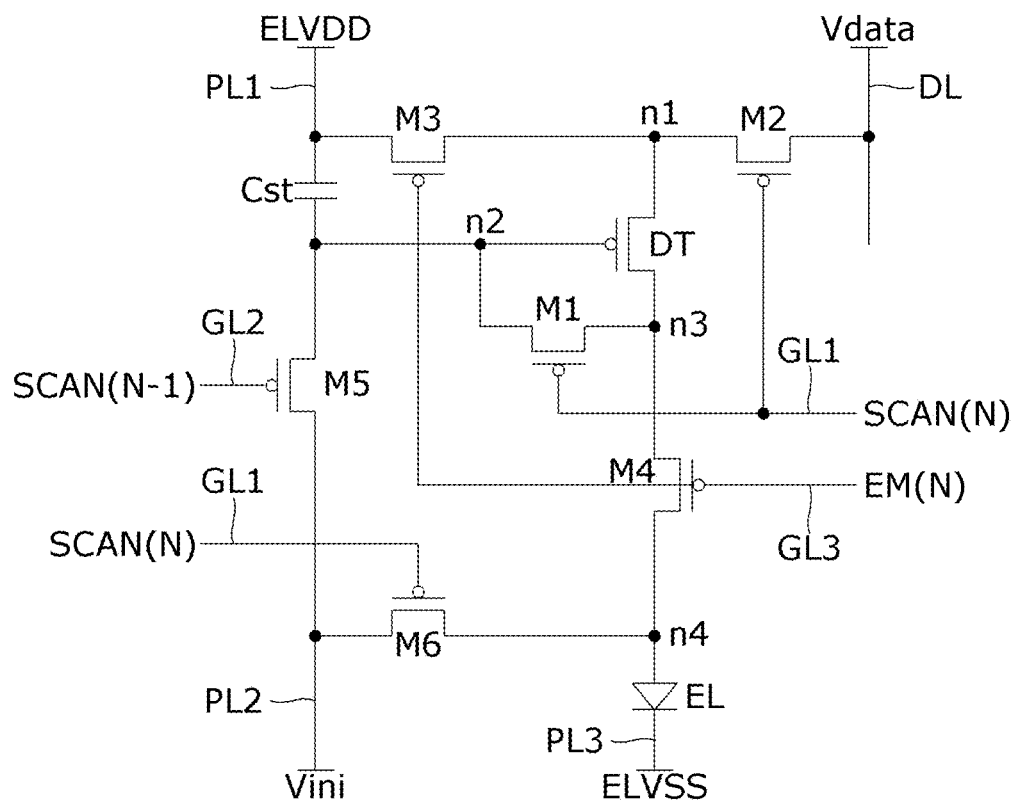

FIGS. 7 to 9 are circuit diagrams illustrating various pixel circuits applicable to the pixel circuits of the present disclosure. It should be noted that the pixel circuits of the present disclosure are not limited to those illustrated in FIGS. 7 to 9.

Referring to FIG. 7, a pixel circuit includes a light-emitting element EL, a driving element DT that supplies a current to the light-emitting element EL, a switching element M01 that connects data lines DL in response to a scan pulse SCAN, and a capacitor Cst connected to a gate electrode of the driving element DT. In the pixel circuit, the driving element DT and the switching element M01 can be implemented as n-channel transistors.

The switching element M01 is turned on according to a gate on voltage of the scan pulse SCAN to connect the data line DL to the gate electrode of the driving element DT.

The driving element DT includes a first electrode connected to a VDD line PL to which a pixel driving voltage ELVDD is applied, a gate electrode connected to the switching element M01 and the capacitor Cst, and a second electrode connected to the light-emitting element EL. The driving element DT supplies a current to the light-emitting element EL according to a gate-source voltage Vgs to drive the light-emitting element EL. When a forward voltage between an anode and a cathode is greater than or equal to a threshold voltage of the light-emitting element EL, the light-emitting element EL is turned on and emits light.

The capacitor Cst is disposed between and connected to the gate electrode and a second electrode of the driving element DT and stores the gate-source voltage Vgs.

Referring to FIG. 8, the pixel circuit can further include a second switching element M02 disposed between and connected to a reference voltage line REFL and the second electrode of the driving element DT. In the pixel circuit, the driving element DT and the switching elements M01 and M02 can be implemented as n-channel transistors.

The second switching element M02 is turned on according to the gate on voltage of the scan pulse SCAN or a sensing pulse SENSE to connect the reference voltage line REFL, to which a reference voltage VREF is applied, to the second electrode of the driving element DT.

In a sensing mode, a current flowing through a channel of the driving element DT or a voltage between the driving element DT and the light-emitting element EL can be sensed through the reference line REFL. The current flowing through the reference line REFL is converted into a voltage using an integrator and is converted into digital data using an analog-to-digital converter (hereinafter, referred to as an "ADC"). The digital data is sensing data including the threshold voltage of the driving element DT or mobility information. The sensing data can be transmitted to a compensation unit of the drive IC DIC. The compensation unit can receive the sensing data from the ADC and compensate for a deviation or change in the threshold voltage of the driving element DT by adding or multiplying a compensation value selected based on the sensing data to or by pixel data.

The pixel circuits illustrated in FIGS. 7 and 8 can further include an EM switching element that switches a current path of the light-emitting element EL in response to the EM pulse. The EM switching element can be disposed between and connected to the pixel driving voltage ELVDD and the driving element DT or disposed between and connected to the driving element DT and the light-emitting element (e.g., OLED).

Figure 10:
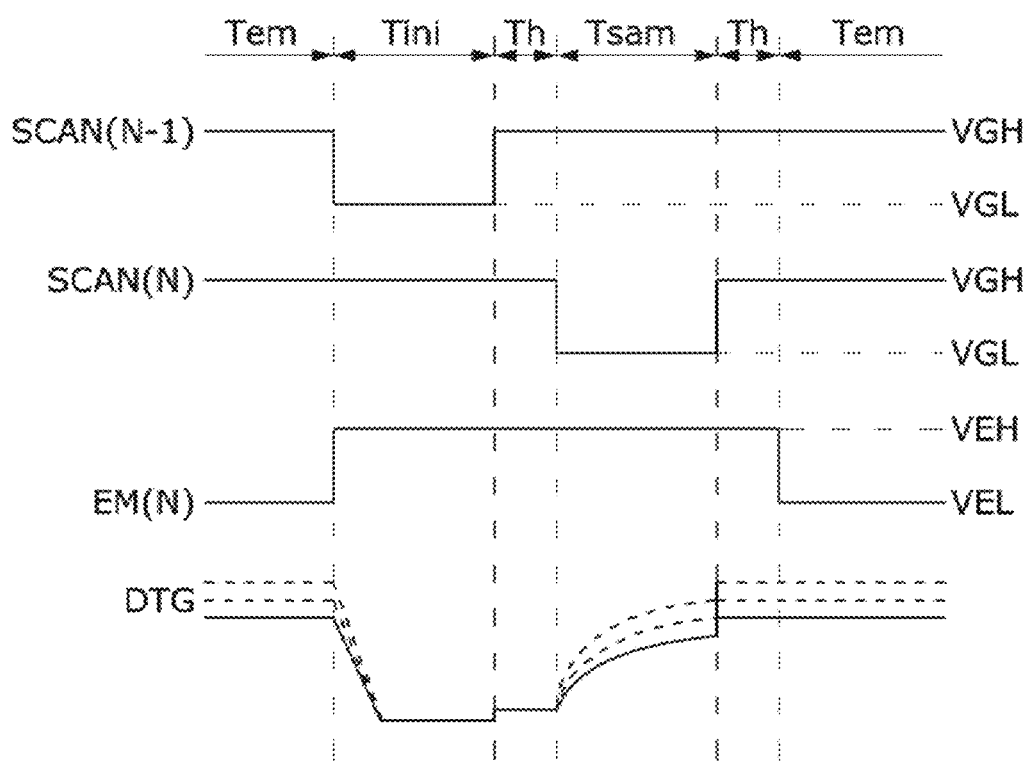
FIG. 10 is a waveform diagram illustrating driving signals applied to the pixel circuit illustrated in FIG. 9 according to an embodiment of the present disclosure.

FIG. 9 is a circuit diagram illustrating an example of a pixel circuit to which an internal compensation circuit is applied. FIG. 10 is a waveform diagram illustrating driving signals applied to the pixel circuit illustrated in FIG. 9.

Referring to FIGS. 9 and 10, the pixel circuit includes a light-emitting element EL, a driving element DT that supplies a current to the light-emitting element EL, and switch circuits that switch voltages applied to the light-emitting element EL and the driving element DT.

The switch circuits are connected to power lines PL1, PL2, and PL3, to which a pixel driving voltage ELVDD, a low potential power voltage ELVSS, and an initialization voltage Vini are applied, data lines DL, and gate lines GL1, GL2, and GL3. The switch circuits switch voltages applied to the light-emitting element EL and the driving element DT in response to scan pulses SCAN(N-1) and SCAN(N) and an EM pulse EM(N).

The switch circuit samples a threshold voltage Vth of the driving element DT using a plurality of switching elements M1 to M6 to store the sampled threshold voltage Vth of the driving element DT in a capacitor Cst, and compensates a gate voltage of the driving element DT with the threshold voltage Vth of the driving element DT. Each of the driving element DT and the switching elements M1 to M6 can be implemented as a p-channel transistor.

A driving period of the pixel circuit can be divided into an initialization period Tini, a sampling period Tsam, and an emission period Tem, as illustrated in FIG. 10.

An Nth scan pulse SCAN(N) is generated as a gate on voltage VGL in the sampling period Tsam and applied to a first gate line GL1. An (N-1)th scan pulse SCAN(N-1) is generated prior to the Nth scan pulse SCAN(N) and applied to a second gate line GL2. The initialization period Tini is defined by the (N-1)th scan pulse SCAN(N-1). The EM pulse EM(N) is generated as a gate off voltage VEH in the initialization period Tini and the sampling period Tsam and applied to a third gate line GL3.

During the initialization period Tini, the (N-1)th scan pulse SCAN(N-1) is generated as a gate on voltage VGL and applied to the second gate line GL2. During the initialization period Tini, voltages of the first and third gate lines GL1 and GL3 are gate off voltages VGH and VEH.

During the sampling period Tsam, the Nth scan pulse SCAN(N) is generated as a pulse of the gate on voltage VGL and applied to the first gate line GL1. During the sampling period Tsam, voltages of the second and third gate lines GL2 and GL3 are gate off voltages VGH.

During at least one section of the emission period Tem, the EM pulse EM(N) is generated as a gate on voltage VEL and applied to the third gate line GL3. During the emission period Tem, the voltages of the first and second gate lines GL1 and GL2 are the gate off voltage VGH.

An anode of the light-emitting element EL is connected to a fourth node n4 disposed between fourth and sixth switching elements M4 and M6. The fourth node n4 is connected to the anode of the light-emitting element EL, a second electrode of a fourth switching element M4, and a second electrode of a sixth switching element M6. A cathode of the light-emitting element EL is connected to a VSS line PL3 to which the low potential power voltage ELVSS is applied. The light-emitting element EL emits light with a current flowing according to a gate-source voltage Vgs of the driving element DT. A current path of the light-emitting element EL is switched by the second and fourth switching elements M2 and M4.

The capacitor Cst is disposed between and connected to a VDD line PL1 and a second node n2. The capacitor Cst includes a first electrode connected to the VDD line PL1 and a second electrode connected to the second node n2. Data voltage Vdata compensated with a threshold voltage Vth of the driving element DT is charged in the capacitor Cst. Since data voltage Vdata is compensated with the threshold voltage Vth of the driving element DT in each subpixel, the subpixels are compensated for a variation (or change) of the characteristics of the driving element DT.

A first switching element M1 is turned on in response to the gate on voltage VGL of the Nth scan pulse SCAN(N) and connects the second node n2 to a third node n3. The second node n2 is connected to a gate electrode of the driving element DT, the second electrode of the capacitor Cst, and a first electrode of the first switching element M1. The third node n3 is connected to a second electrode of the driving element DT, a second electrode of the first switching element M1, and a first electrode of the fourth switching element M4. A gate electrode of the first switching element M1 is connected to the first gate line GL1 to receive the Nth scan pulse SCAN(N). The first electrode of the first switching element M1 is connected to the second node n2, and the second electrode of the first switching element M1 is connected to the third node n3.

Since the first switching element M1 is turned on during one very short horizontal period 1H, in which the Nth scan pulse SCAN(N) is generated as the gate on voltage VGL in one frame period, a leakage current can be generated in an off state. In order to suppress the leakage current of the first switching element M1, the first switching element M1 can be implemented as a transistor having a dual gate structure in which two transistors are connected in series.

The second switching element M2 is turned on in response to the gate on voltage VGL of the Nth scan pulse SCAN(N) to supply the data voltage Vdata to the first node n1. A gate electrode of the second switching element M2 is connected to the first gate line GL1 to receive the Nth scan pulse SCAN(N). A first electrode of the second switching element M2 is connected to the first node n1. A second electrode of the second switching element M2 is connected to the data line DL to which the data voltage Vdata is applied. The first node n1 is connected to the first electrode of the second switching element M2, a second electrode of a third switching element M3, and a first electrode of the driving element DT.

The third switching element M3 is turned on in response to the gate on voltage VEL of the EM pulse EM(N) to connect the VDD line PL1 to the first node n1. A gate electrode of the third switching element M3 is connected to the third gate line GL3 to receive the EM pulse EM(N). A first electrode of the third switching element M3 is connected to the VDD line PL1. A second electrode of the third switching element M3 is connected to the first node n1.

The fourth switching element M4 is turned on in response to the gate on voltage VEL of the EM pulse EM(N) to connect the third node n3 to the fourth node n4. A gate electrode of the fourth switching element M4 is connected to the third gate line GL3 to receive the EM pulse EM(N). The first electrode of the fourth switching element M4 is connected to the third node n3, and a second electrode of the fourth switching element M4 is connected to the fourth node n4.

A fifth switching element M5 is turned on in response to a gate on voltage VGL of the (N−1)th scan pulse SCAN(N−1) to connect the second node n2 to a Vini line PL2. A gate electrode of the fifth switching element M5 is connected to the second gate line GL2 to receive the (N−1)th scan pulse SCAN(N−1). A first electrode of the fifth switching element M5 is connected to the second node n2, and a second electrode of the fifth switching element M5 is connected to the Vini line PL2 to which the initialization voltage Vini is applied. In order to suppress a leakage current of the fifth switching element M5, the fifth switching element M5 can be implemented as a transistor having a dual gate structure in which two transistors are connected in series.

The sixth switching element M6 is turned on in response to the gate on voltage VGL of the Nth scan pulse SCAN(N) to connect the Vini line PL2 to the fourth node n4. A gate electrode of the sixth switching element M6 is connected to the first gate line GL1 to receive the Nth scan pulse SCAN(N). A first electrode of the sixth switching element M6 is connected to the Vini line PL2, and the second electrode is connected to the fourth node n4. In another embodiment, the gate electrodes of the fifth and sixth switching elements M5 and M6 can be commonly connected to the second gate line GL2 to which the (N−1)th scan pulse SCAN(N−1) is applied. In this situation, the fifth and sixth switching elements M5 and M6 can be simultaneously turned on in response to the (N−1)th scan pulse SCAN(N−1) in the initialization period Tini.

The driving element DT adjusts a current flowing through the light-emitting element EL according to the gate-source voltage Vgs to drive the light-emitting element EL. The driving element DT includes the gate electrode connected to the second node n2, the first electrode connected to the first node n1, and the second electrode connected to the third node n3.

During the initialization period Tini, the (N−1)th scan pulse SCAN(N−1) is generated as the gate on voltage VGL. The Nth scan pulse SCAN(N) and the EM pulse EM(N) maintain the gate off voltages VGH and VEH during the initialization period Tini. Therefore, during the initialization period Tini, the fifth switching element M5 is turned on and the second node n2 is initialized to the initialization voltage Vini. When the fifth and sixth switching elements M5 and M6 are turned on during the initialization period Tini, the second and fourth nodes n2 and n4 are initialized to the initialization voltage Vini.

A holding period Th can be set between the initialization period Tini and the sampling period Tsam and between the sampling period Tsam and the emission period Tem. In the holding period Th, the scan pulses SCAN(N−1) and SCAN(N) and the EM pulse EM(N) are the gate off voltages VGH, and the main nodes n1 to n4 of the pixel circuit are floated.

During the sampling period Tsam, the Nth scan pulse SCAN(N) is generated as the gate on voltage VGL. A pulse of the Nth scan pulse SCAN(N) is synchronized with the data voltage Vdata of the pixel data to be written in the subpixels of the Nth pixel line. The (N−1)th scan pulse SCAN(N−1) and the EM pulse EM(N) are the gate off voltages VGH and VEH during the sampling period Tsam. Therefore, during the sampling period Tsam, the first and second switching elements M1 and M2 are turned on. In this situation, the sixth switching element M6 is also turned on to supply the initialization voltage Vini to the fourth node n4, and thus light emission of the light-emitting element EL is prevented.

During the sampling period Tsam, a gate voltage DTG of the driving element DT is increased by the current flowing through the first and second switching elements M1 and M2. In the sampling period Tsam, the threshold voltage Vth of the driving element DT is sampled by the capacitor Cst.

During the emission period Tem, the EM pulse EM(N) can be generated as the gate on voltage VGL. During the emission period Tem, the voltage of the EM pulse EM(N) can be inverted with a predetermined duty ratio. Therefore, the EM pulse EM(N) can be generated as the gate on voltage VGL during at least a portion of the emission period Tem.

When the EM pulse EM(N) is the gate on voltage VEL, a current flows between the pixel driving voltage ELVDD and the light-emitting element EL, and thus the light-emitting element EL can emit light. During the emission period Tem, the (N−1)th and Nth scan pulses SCAN(N−1) and SCAN(N) are the gate off voltages VGH. During the emission period Tem, the third and fourth switching elements M3 and M4 are turned on in response to the gate on voltage VEL of the EM pulse EM(N). When the EM pulse EM(N) is the gate on voltage VEL, the third and fourth switching elements M3 and M4 are turned on and the current flows through the light-emitting element EL. During the emission period Tem, the current flowing through the light-emitting element EL is K(ELVDD-Vdata)$^2$. K denotes a constant value determined by charge mobility, parasitic capacitance, and channel capacitance of the driving element DT.

Figure 11:
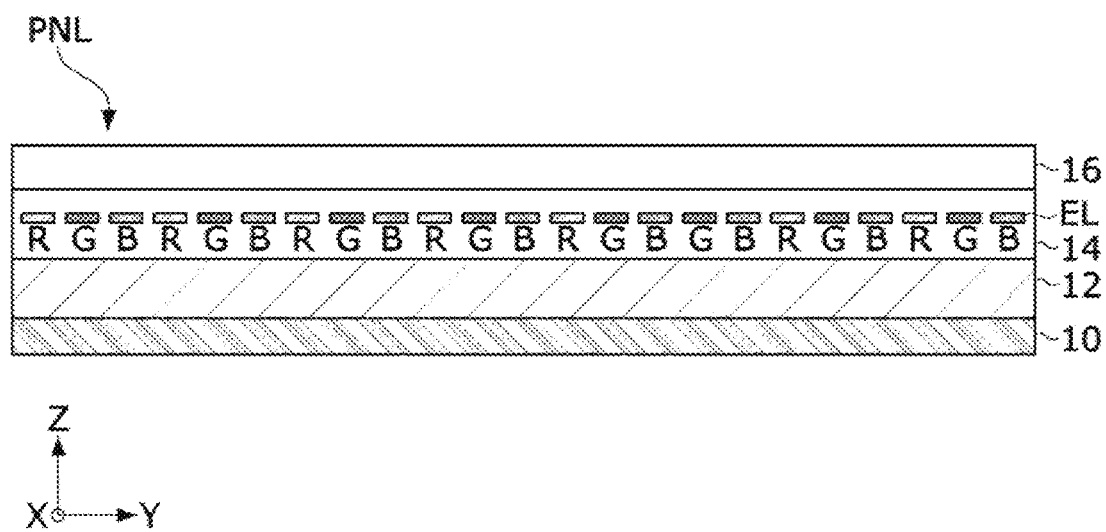
FIG. 11 is a cross-sectional view illustrating a structure of a display panel according to an embodiment of the present disclosure.
Figure 12:
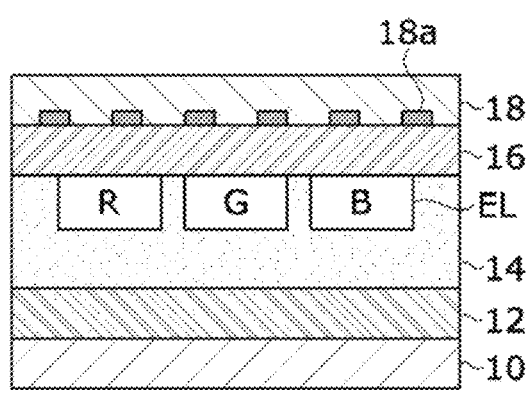
FIG. 12 is a cross-sectional view illustrating a structure of a display panel according to another embodiment of the present disclosure.
Figure 13:
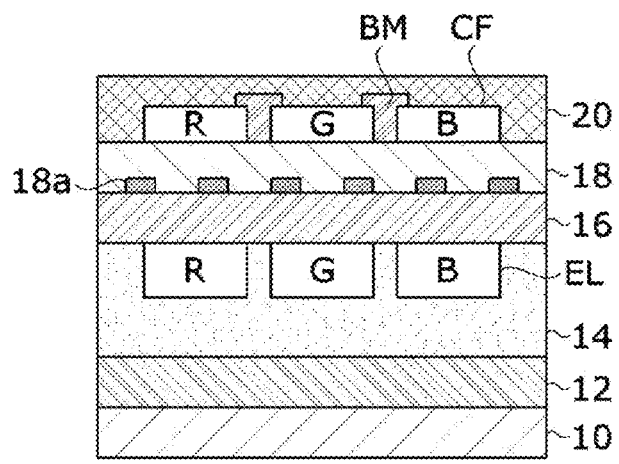
FIG. 13 is a cross-sectional view illustrating a structure of a display panel according to still another embodiment of the present disclosure.

FIGS. 11 to 13 are cross-sectional views illustrating structures of display panels according to embodiments of the present disclosure.

Referring to FIG. 11, a display panel PNL can include a circuit layer 12, a light-emitting element layer 14, and an encapsulation layer 16, which are stacked on a glass substrate 10.

The glass substrate 10 can be made of plate-shaped alkali-free glass or non-alkali glass. The glass substrate 10 is not deformed when resistance against an impact is greater than that of a plastic substrate.

The circuit layer 12 can include pixel circuits connected to interconnections, such as data lines, gate lines, power lines, and the like, a gate driver GIP connected to the gate lines and the like. The interconnections and circuit elements of the circuit layer 12 can include a plurality of insulating layers, two or more metal layers separated from each other with the insulating layers interposed therebetween, and an active layer including a semiconductor material.

The light-emitting element layer 14 can include light-emitting elements EL driven by the pixel circuits. The light-emitting elements EL can include red light-emitting elements, green light-emitting elements, and blue light-emitting elements. In another embodiment, the light-emitting element layer 14 can include a white light-emitting element and a color filter. The light-emitting elements EL of the light-emitting element layer 14 can be covered by a protective layer including an organic film and a protective film.

The encapsulation layer 16 covers the light-emitting element layer 14 to seal the circuit layer 12 and the light-emitting element layer 14. The encapsulation layer 16 can have a multi-insulating film structure in which an organic film and an inorganic film are alternately stacked. The inorganic film blocks the penetration of moisture or oxygen. The organic film planarizes a surface of the inorganic film. When the organic film and the inorganic film are stacked in multiple layers, a movement path of the moisture or oxygen becomes longer than when the organic film and the inorganic film are formed as a single layer, and thus the penetration of moisture/oxygen affecting the light-emitting element layer 14 can be effectively blocked.

Referring to FIG. 12, a display panel PNL can further include a touch sensor layer 18 formed on an encapsulation layer 16. The touch sensor layer 18 can be implemented as capacitive type touch sensors that sense a touch input based on a change in capacitance before and after the touch input. The touch sensor layer 18 includes conductor interconnection patterns 18a that form the capacitance of the touch sensors. The capacitance of the touch sensors can be formed between the conductor interconnection patterns 18a.

The touch sensor layer 18 can include an organic film that covers the conductor interconnection patterns 18a of the touch sensors. An extended portion of the organic film can cover a residual inorganic film or a glass substrate 10 in a bezel region BZ, that is, an edge region, of the display panel PNL.

Also, a polarizing plate can be adhered onto the touch sensor layer 18. The polarizing plate can convert polarization of external light reflected by metal patterns of the circuit layer 12, and thus visibility and a contrast ratio can be improved. The polarizing plate can be implemented as a polarizing plate in which a linear polarizing plate and a phase delay film are bonded, or a circular polarizing plate. A cover glass can be adhered onto the polarizing plate.

Referring to FIG. 13, a display panel PNL can further include a touch sensor layer 18 formed on an encapsulation layer 16, and a color filter layer 20 formed on the touch sensor layer 18.

The color filter layer 20 may include red, green, blue filters CF. Further, the color filter layer 20 can further include black matrix patterns BM. The color filter layer 20 can absorb a portion of a wavelength of light reflected by a circuit layer 12 to serve as a polarizing plate, and thus color purity can be increased. In the present embodiment, the color filter layer 20 having a higher light transmittance than the polarizing plate can be applied to the display panel PNL, and thus light transmittance of the display panel PNL can be improved and the thickness and flexibility of the display panel PNL can be improved. Also, a cover glass can be adhered onto the color filter layer 20.

The color filter layer 20 can include an organic film that covers the color filters and the black matrix patterns. An extended portion of the organic film can cover a residual inorganic film or a glass substrate 10 in a bezel region BZ, that is, an edge region, of the display panel PNL.

FIGS. 14 to 17 are cross-sectional views illustrating structures of edge regions of display panels PNL according to embodiments of the present disclosure. In FIGS. 14 to 17, reference label "EDGE" indicates a side surface of the display panel PNL on at least one side of four sides of the display panel PNL. The side surface EDGE of the display panel PNL is exposed to the outside.

Referring to FIGS. 14 to 17, in a bezel region BZ of the display panel PNL, an organic film 30 covers a residual inorganic film 16a extending from an encapsulation layer 16.

A glass substrate 10 has a tapered surface 10a in an end region close to the side surface EDGE of the display panel PNL, and the tapered surface 10a of the glass substrate 10 is positioned in the bezel region BZ of the display panel PNL or in a shaded region in which the residual inorganic film is present. A thickness of glass on the tapered surface 10a of the glass substrate 10 is gradually reduced toward the side surface EDGE of the display panel PNL.

The edge of the display panel PNL includes the residual inorganic film 16a formed on the glass substrate 10, and the organic film 30 that covers the residual inorganic film 16a. The edge of the display panel PNL can further include one or more dam patterns 15.

The residual inorganic film 16a can be a thin residual film that extends over the dam patterns 15 when an upper inorganic film of the encapsulation layer 16 is formed. Since heat and cracks may propagate through the residual inorganic film 16a, the residual inorganic film 16a may not be exposed at the side surface of the display panel PNL. Alternatively, on the side surface of the display panel PNL, the residual inorganic film 16a can be exposed with a very small thickness with which heat and cracks do not propagate.

The dam patterns 15 can protrude from the glass substrate 10 in a region between the end of the circuit layer 12 and the side surface EDGE of the display panel PNL or on an outer region.

The dam pattern 15 blocks an organic film material of the encapsulation layer 16 over the end of the edge of the display panel PNL in the process of forming the encapsulation layer 16 on the display panel PNL. The dam pattern 15 can be formed of an organic film or an inorganic film, which constitutes the circuit layer 12 and the light-emitting element layer 14, or can be formed to have a multi-layer structure in which an inorganic film and an organic film are stacked.

The organic film 30 covers the residual inorganic film 16a. The organic film 30 is thicker than the residual inorganic film 16a. In a selective glass etching process, the organic film 30 serves as an etch stopper, and thus the glass substrate 10 is etched up to the organic film 30. The residual inorganic film 16a covered by the organic film 30 on the side surface EDGE of the display panel PNL is exposed with a small thickness. Therefore, it is possible to solve the heat and crack propagation problem through the residual inorganic film 16a.

The organic film 30 can be a portion extending from the organic film that covers conductor interconnection patterns of a touch sensor layer 18 and planarizes a surface thereof or can be a portion extending from the organic film that covers the color filters and the black matrix patterns in the color filter layer 20 and planarizes a surface thereof.

The residual inorganic film 16a extending from the encapsulation layer 16 can be exposed at the side surface EDGE of the display panel PNL, and the organic film 30 that is formed thereon and covers the residual inorganic film 16a can be exposed. The residual inorganic film 16a can not be exposed at the side surface of the display panel PNL, and a portion of the organic film 30 that covers the residual inorganic film 16a can be exposed.

Since the residual inorganic film 16a is hardly exposed at the side surface EDGE of the display panel PNL, a separate crack stopper is not required. Therefore, the bezel region BZ of the display panel PNL can be minimized.

Figure 14:
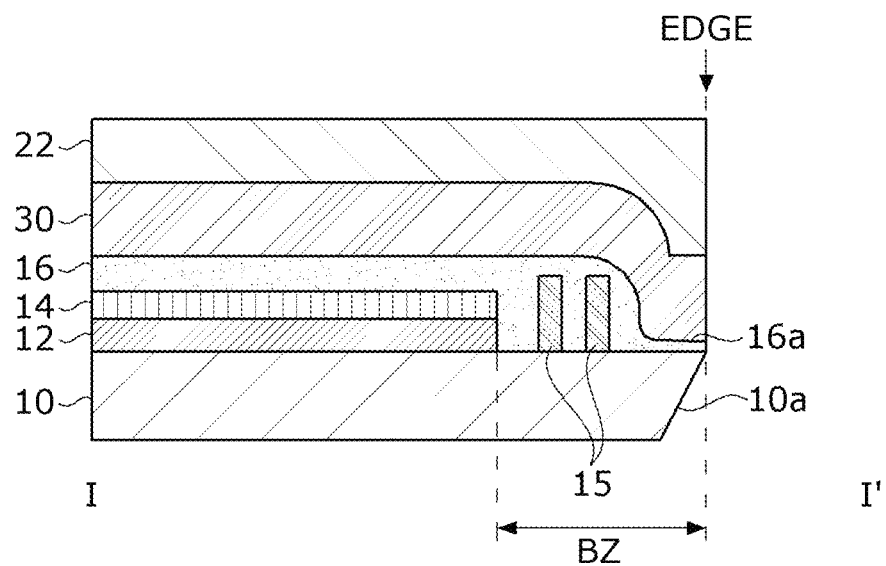
FIGS. 14 to 17 are cross-sectional views illustrating structures of edge regions of display panels (PNL) according to embodiments of the present disclosure.

In the side surface EDGE of the display panel PNL, a polarizing plate 22, the organic film 30, the residual inorganic film 16a, and the glass substrate 10 can be substantially exposed at a surface with no step difference, as illustrated in FIG. 14. In this situation, the residual inorganic film 16a can be exposed or can be partially exposed at the side surface EDGE. For example, the edge of the polarizing plate 22 and the edge of the organic film 30 can each be much thicker than the edge of the residual inorganic film 16a.

Figure 15:
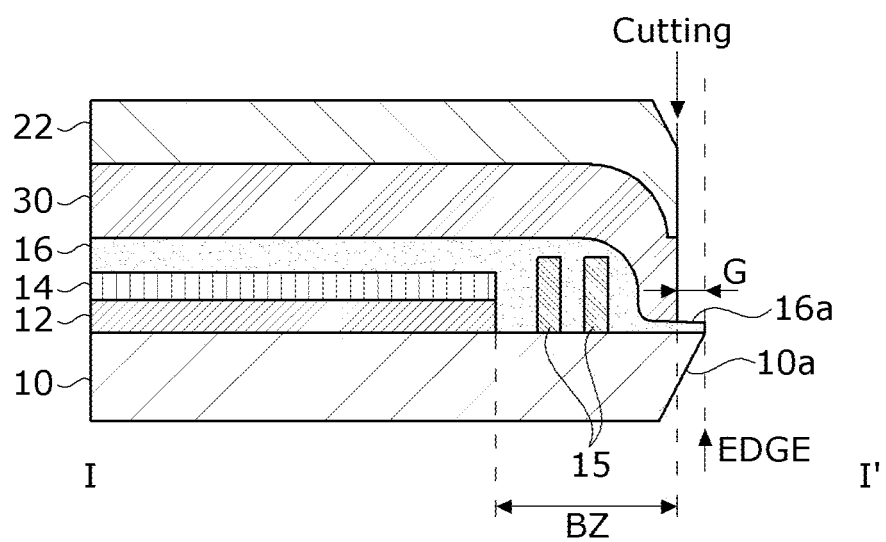

As illustrated in FIG. 15, a polarizing plate 22 can be cut at a position spaced a predetermined distance G inward from the side surface EDGE of the display panel PNL. In this situation, the glass substrate 10 can further protrude outward further than the polarizing plate 22, and thus the glass substrate 10 and the polarizing plate 22 can have a step or a stepped portion. The organic film 30, which is stacked on the glass substrate 10, can substantially match an end of a side surface of the polarizing plate 22, and thus there can be little step difference therebetween.

Figure 16:
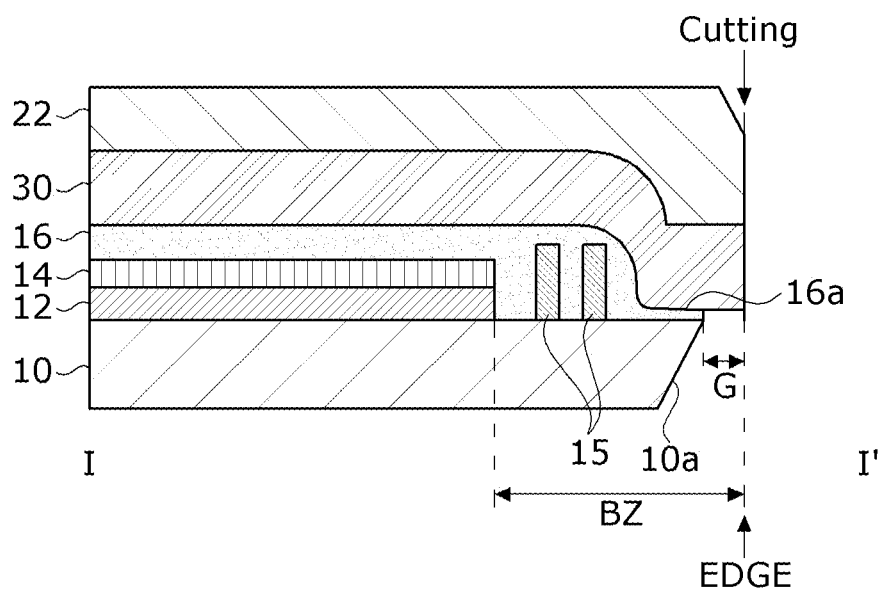

As illustrated in FIG. 16, a polarizing plate 22 can be cut at a position spaced a predetermined distance G outward from the side surface EDGE of the display panel PNL. In this situation, the polarizing plate 22 can protrude further outward than the glass substrate 10, and thus the glass substrate 10 and the polarizing plate 22 can have a step or a stepped portion. The organic film 30, which is stacked on the glass substrate 10, can substantially match the end of the side surface of the polarizing plate 22, and thus there can be little step difference therebetween.

Figure 17:
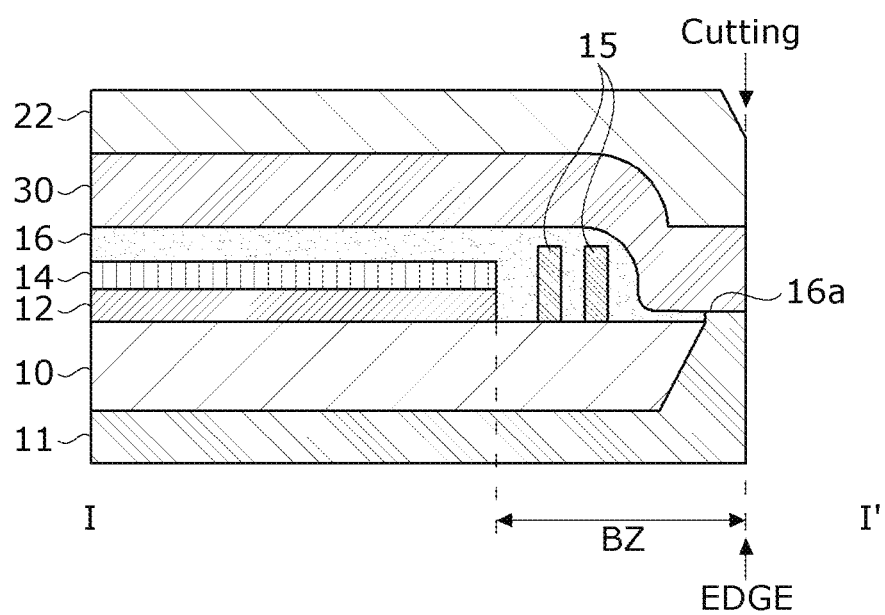

A circuit layer 12, a light-emitting element layer 14, and an encapsulation layer 16 can be stacked on a front surface of the glass substrate 10, and an organic film 11 for glass protection can be formed on a rear surface of the glass substrate 10, as illustrated in FIG. 17. The polarizing plate 22 can be cut at a position at which the polarizing plate 22, the organic film 30, and the organic film 11 for glass protection are stacked. In this situation, as illustrated in FIG. 17, the organic film 11 for glass protection, the organic film 30, and the polarizing plate 22 can be substantially exposed at the side surface EDGE of the display panel PNL without a step difference.

As illustrated in FIG. 17, the organic film 11 for glass protection and the organic film 30 can be in direct contact with each other on the side surface EDGE of the display panel PNL. In this situation, the residual inorganic film 16a can not be exposed at the side surface EDGE of the display panel. In other words, the edge of the residual inorganic film 16a can be enclosed and protected by the organic film 30 and the organic film 11.

Although the polarizing plate 22 can be disposed on the organic film 30, the polarizing plate 22 can be omitted from the structure of the display panel of FIG. 13.

In the manufacturing process of the display panel PNL, each of a plurality of cells separated from a mother substrate (mother glass) can be manufactured as a single display panel. The mother substrate can be applied to a multi-layer process in order to reduce manufacturing costs of the display panel, and thus a plurality of cells can be simultaneously formed on the mother substrate.

Figure 18:
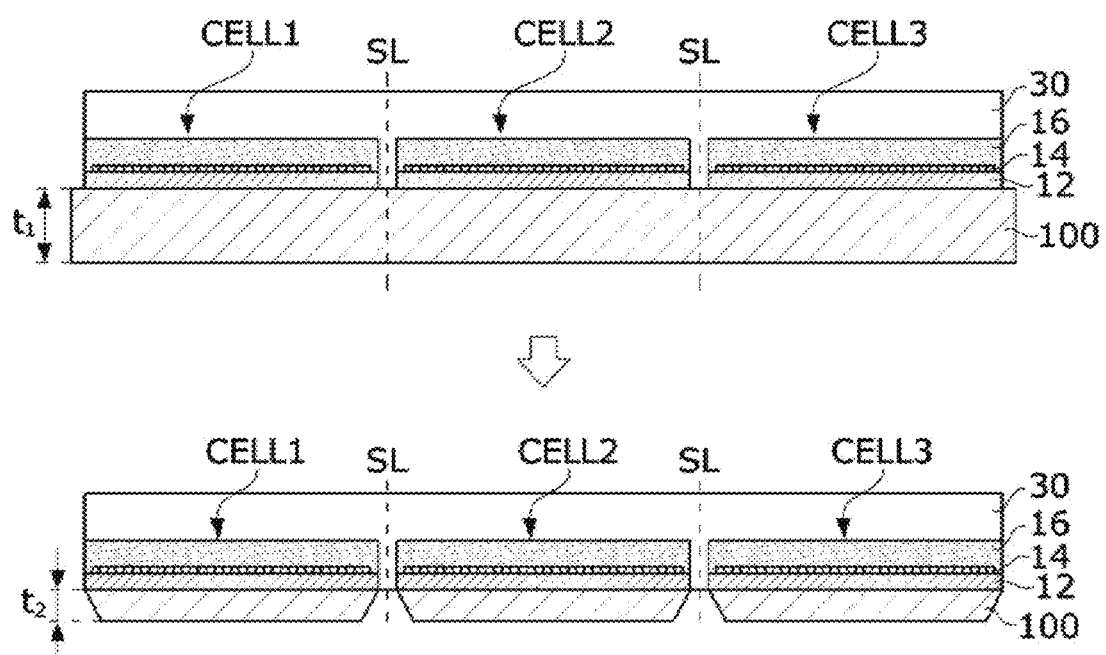
FIG. 18 is a view illustrating a plurality of cells formed on a mother substrate according to an embodiment of the present disclosure.
Figure 19:
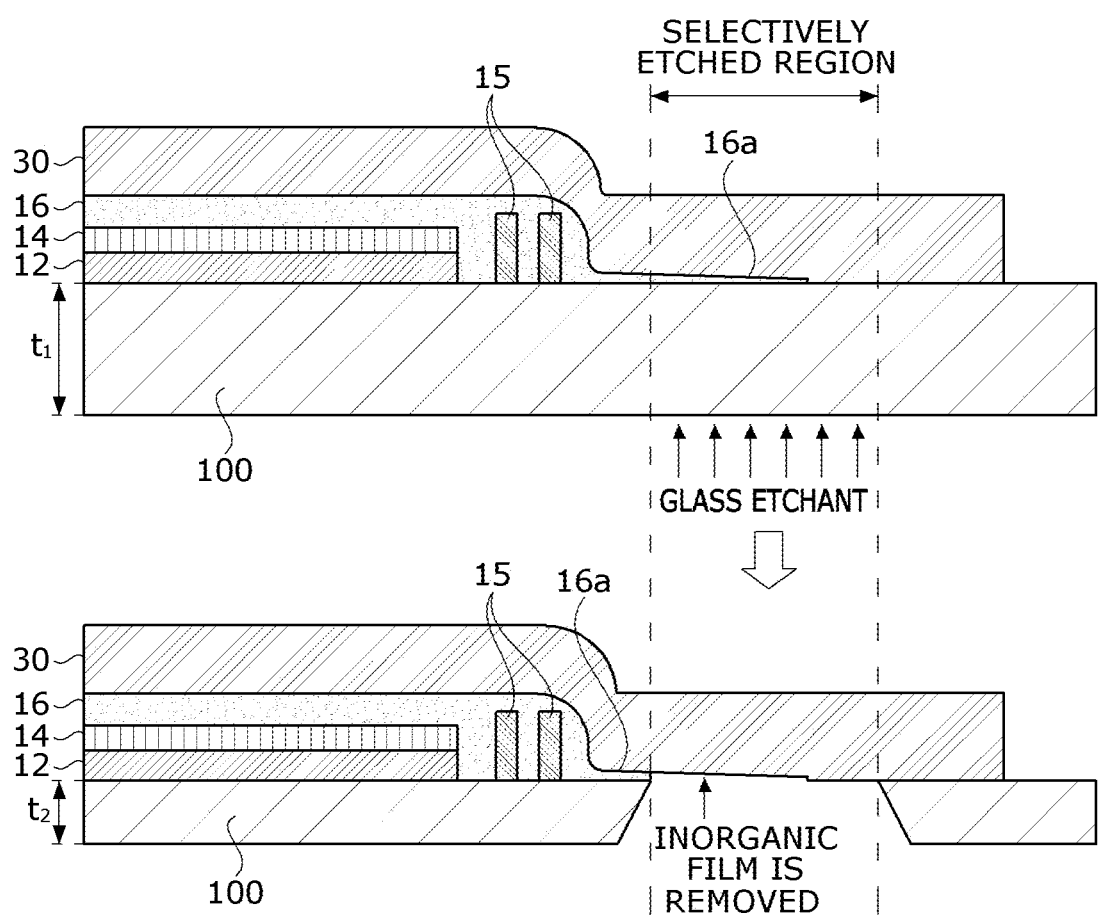
FIG. 19 is a view illustrating a selective glass etching process according to an embodiment of the present disclosure.
Figure 20:
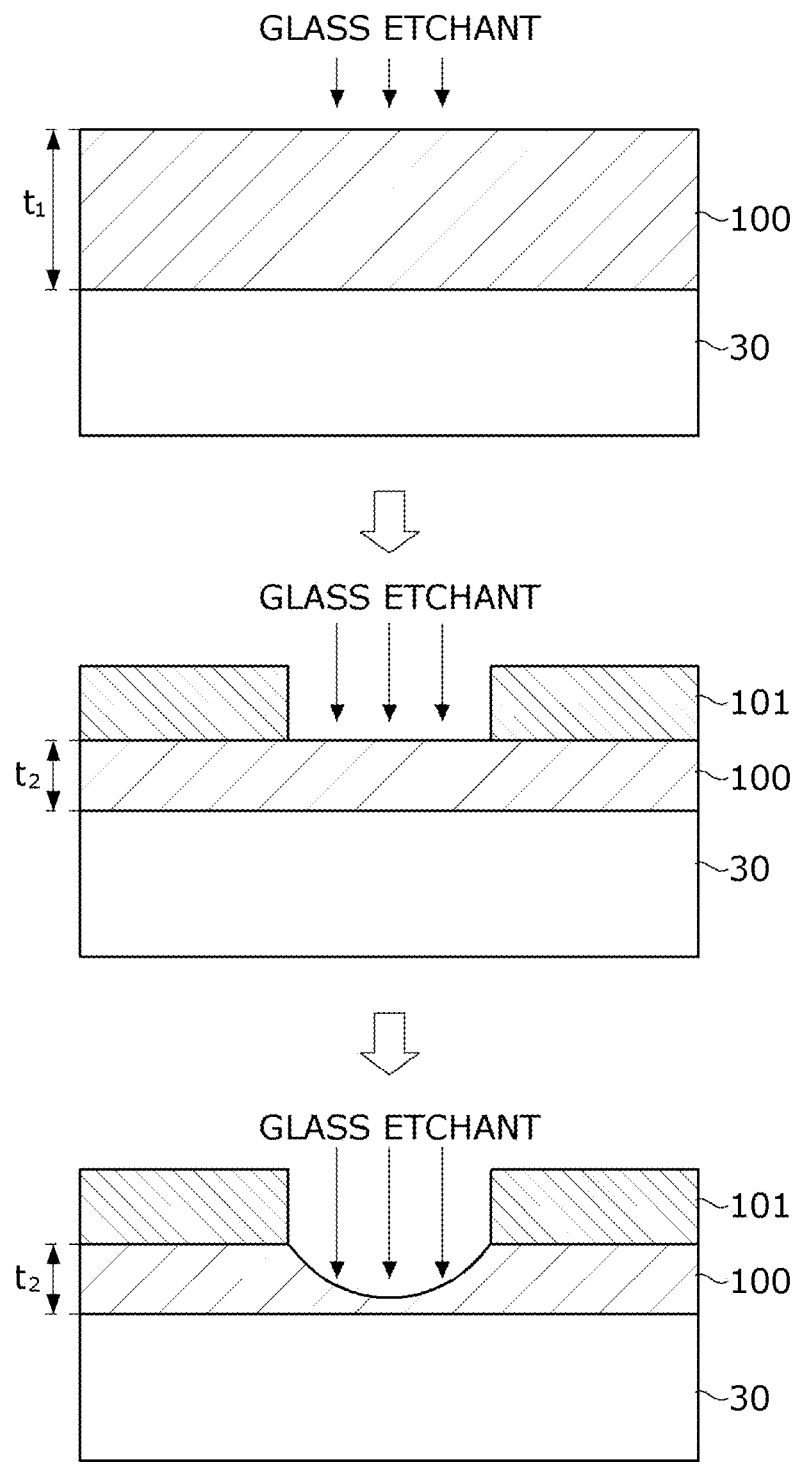
FIGS. 20 to 22 are views illustrating an entire glass etching process and a selective glass etching process in time series according to embodiments of the present disclosure.
Figure 21:
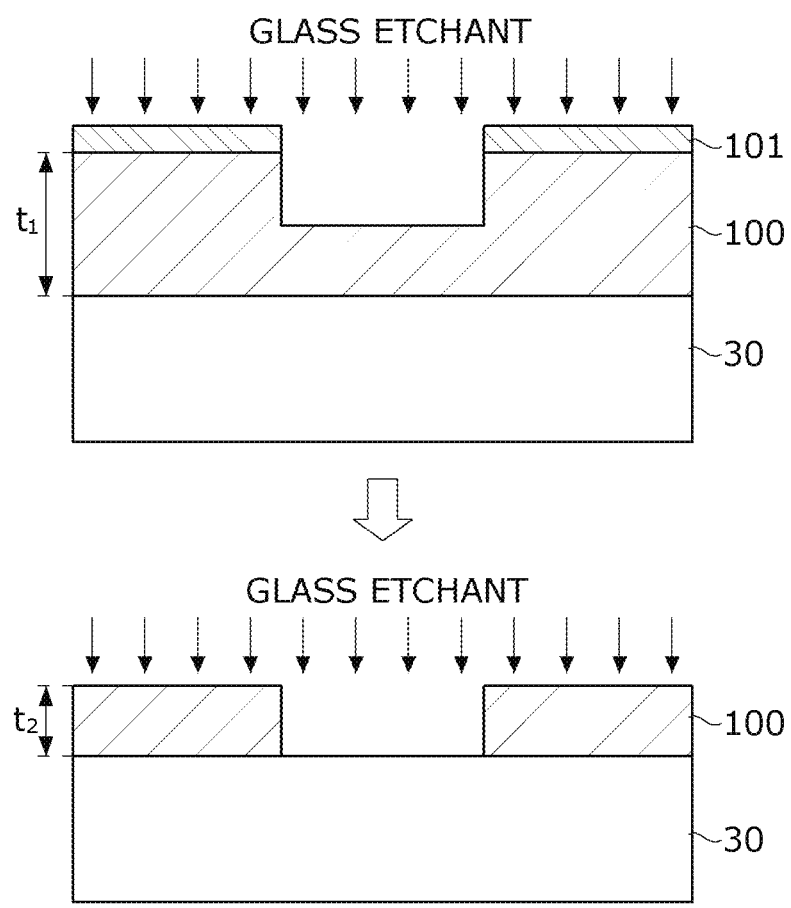
Figure 22:
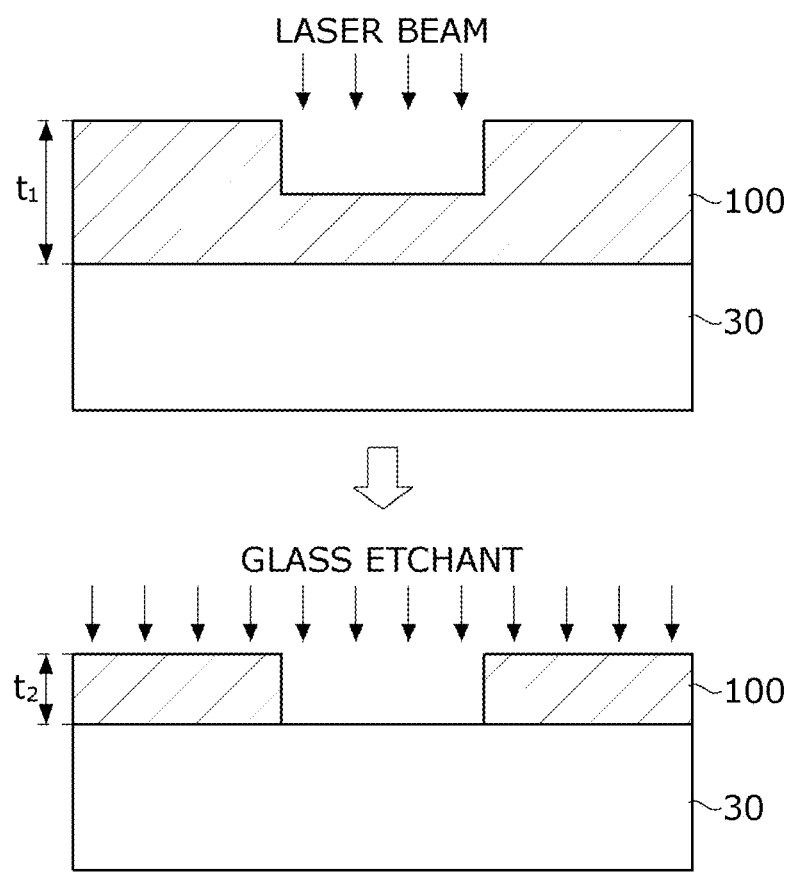

FIG. 18 is a view illustrating a plurality of cells formed on a mother substrate. FIG. 19 is a view illustrating a selective glass etching process. FIGS. 20 to 22 are views illustrating an entire glass etching process and a selective glass etching process in time series.

Referring to FIGS. 18 to 22, a plurality of cells CELL1 to CELL3 can be simultaneously formed on a mother substrate 100, which is a large glass substrate. One cell can include a pixel array AA and a gate driver GIP of a single display panel. In an etching process, a thickness t1 of 500 μm of the mother substrate 100 can be reduced to a thickness t2 of 200 μm or less.

In order to reduce the thickness of the mother substrate 100 and partially remove glass, the entire glass etching process and the selective glass etching process can be performed. In order to divide the mother substrate 100 in units of cells, a scribing process and a laser trimming process can be performed or the laser trimming process can be performed.

In the entire glass etching process, the thickness of the glass of the mother substrate 100 is reduced. In the selective glass etching process, the mother substrate 100 can be exposed to a glass etchant at a boundary between the cells of the mother substrate 100, and thus the mother substrate 100 can be selectively etched. As a result of the entire glass etching process and the selective etching process, the thickness of the mother substrate 100 is reduced, and the glass is etched from an inter-cell boundary line SL to an organic film 30. In this situation, as illustrated in FIG. 19, an inorganic film can react with the glass etchant in a portion in which the glass is removed, and thus a residual inorganic film 16a can be removed.

As illustrated in FIG. 20, the entire glass etching process can be performed and then the selective glass etching process can be performed. In the entire glass etching process, the entire surface of the mother substrate 100 is etched by the glass etchant, and thus the thickness t1 of the mother substrate 100 is reduced to the thickness t2. After the entire glass etching process is performed, the selective glass etching process can be performed. In the selective glass etching process, a mask film 101 can be formed on a rear surface of the mother substrate 100. The mask film 101 includes an open through-hole through which a portion of the glass of the mother substrate 100 is exposed.

The mother substrate 100 can be etched by spraying an etchant on the mother substrate 100 on which the mask film 101 is formed or by placing the mother substrate 100 in a water tank containing a glass etchant by a dipping method. In the etching process of the mother substrate 100, the organic film 30 can serve as an etch stopper, the glass can be etched until the mother substrate 100 is etched and the glass etchant reaches the organic film 30 (e.g., also see FIG. 19).

The glass etchant reacts with the glass of the mother substrate 100 through the open through-hole of the mask film 101, and thus the glass is etched. By adjusting a time of the selective glass etching process, a depth of the mother substrate 100 etched along an inter-cell boundary line SL, and a length, a thickness, angle, etc. of the tapered surface can be adjusted.

The mask film 101 can be removed or can remain on the glass substrate 10 after the mother substrate 100 is divided in units of cells. Before a process of cutting the polarizing plate 22, the organic film 11 for glass protection can be formed on the rear surface of the glass substrate 10, as illustrated in FIG. 17.

As illustrated in FIG. 21, after the mask film 101 for exposing a selectively etched region including the inter-cell boundary line SL is formed on the rear surface of the mother substrate 100, the glass in the selectively etched region can be etched with a depth lower than the thickness t1 of the mother substrate 100 with the glass etchant. Next, when the mask film 101 is removed and then the rear surface of the mother substrate 100 is entirely etched, the thickness of the mother substrate 100 can be reduced, and the glass and the residual inorganic film 16a can be completely removed in the selectively etched region, as illustrated in FIG. 19.

As illustrated in FIG. 22, in the selectively etched region, after a laser beam is radiated to the mask film 101 and then the glass is removed to the depth lower than the thickness t1 of the mother substrate 100, the entire glass etching process can be performed. In this situation, the glass and the residual inorganic film 16a can be completely removed in the selectively etched region, as illustrated in FIG. 19.

In the scribing process, the mother substrate 100 is cut by a scribing wheel along the inter-cell boundary line SL and divided in units of cells. After the scribing process is performed, in the laser trimming process, the side surface EDGE of each of the display panels PNL is trimmed using a laser cutting device. As illustrated in FIG. 19, since the glass of the mother substrate 100 and the residual inorganic film 16a are completely removed in the selectively etched region, the mother substrate 100 can be divided in units of cells only by the laser trimming process without the scribing process.

Figure 23:
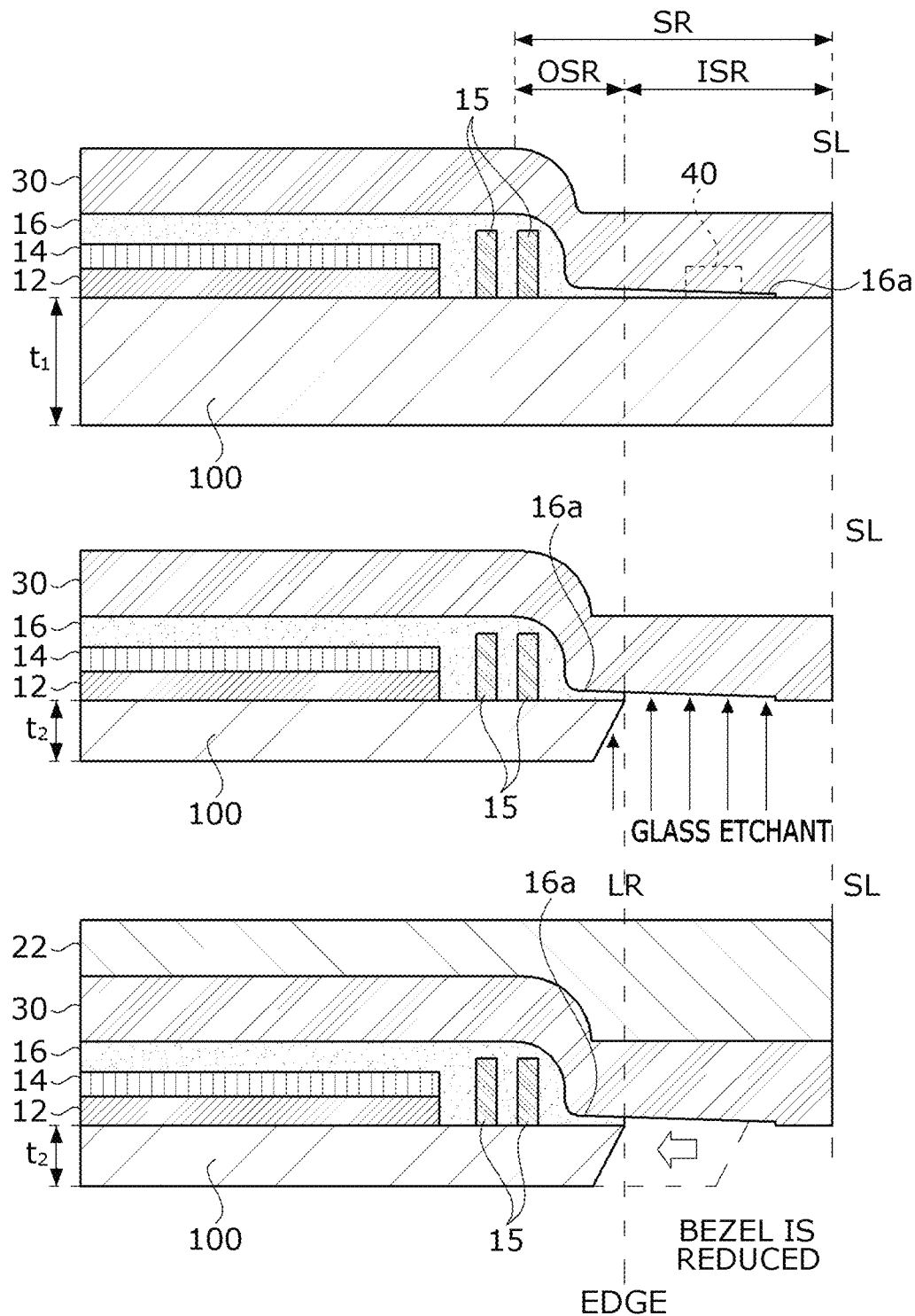
FIG. 23 is a view illustrating a process of reducing a bezel region with a structure in which heat and crack propagation does not occur in a manufacturing process of a display panel in detail according to an embodiment of the present disclosure.

FIG. 23 is a view illustrating a process of reducing a bezel region with a structure in which heat and crack propagation does not occur in a manufacturing process of a display panel in detail.

Referring to FIG. 23, in a mother substrate 100, a crack stopper pattern 40 that blocks crack propagation can be formed in a shaded region SR between an inter-cell boundary line SL and dam patterns 15 or a process can be performed without the crack stopper pattern 40. The crack stopper pattern 40 can be formed of an inorganic film and/or an organic film constituting a circuit layer 12 and a light-emitting element layer 14 and can protrude from the mother substrate 100. The crack stopper pattern 40 can block a path through which cracks propagate toward a pixel array inside the cells through a residual inorganic film 16a in a scribing process or a laser trimming process. The crack stopper pattern 40 can be removed when the mother substrate 100 is divided in units of cells.

The shaded region SR can be divided into an inner shaded region ISR close to the inter-cell boundary line SL and an outer shaded region OSR close to the dam pattern 15.

A thickness of the mother substrate 100 is reduced in an etching process of the mother substrate 100, and, the mother substrate 100 in the shaded region SR is completely removed in a selective etching process. Next, the shaded region SR can be completely removed in a laser trimming process or, for example, the inner shaded region ISR can be partially removed. In FIG. 23, reference label "LR" indicates a laser trimming line. After the laser trimming process is performed, at least a portion of the shaded region SR of the mother substrate 100 can be removed, and thus a bezel region BZ of a display panel PNL can be minimized. In this situation, a side surface EDGE of an end of the display panel PNL can aligned with an end of a tapered surface 10a of a glass substrate 10 as shown in FIGS. 14 and 15.

According to the present disclosure, by applying a glass substrate as a substrate of a display panel, it is possible to implement a display panel that is less affected by an external impact and is not easily deformed as compared to a plastic substrate.

According to the present disclosure, by reducing a thickness of an inorganic film which can serve as a seed or starting point for heat and crack propagation on a side surface of a display panel or by preventing the inorganic film from being exposed, it is possible to prevent heat and crack propagation.

According to the present disclosure, after an encapsulation layer is formed on a display panel, an extended portion of an organic film formed on the encapsulation layer is used as an etch stopper for preventing penetration of a glass etchant at an edge of the display panel, and thus it is possible to minimize a bezel region of the display panel without a process of adding a separate etch stopper.

The effects of the present disclosure are not limited to the above-mentioned effects, and other effects that are not mentioned will be apparently understood by those skilled in the art from the above description and the appended claims.

The objects to be achieved by the present disclosure, the means for achieving the objects, and effects of the present disclosure described above are examples, and thus, the scope of the claims is not limited thereto.

Although the embodiments of the present disclosure have been described in more detail with reference to the accompanying drawings, the present disclosure is not limited thereto and can be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display panel comprising:
a glass substrate;
a circuit layer disposed on the glass substrate;
a light-emitting element layer disposed on the circuit layer;
an encapsulation layer covering the light-emitting element layer; and
a first organic film covering the encapsulation layer,
wherein the first organic film covers an extended portion of an inorganic film extending from the encapsulation layer in a bezel region of the display panel.

2. The display panel of claim 1, further comprising a conductor interconnection pattern formed on the encapsulation layer,
wherein the first organic film covers the conductor interconnection pattern.

3. The display panel of claim 2, further comprising a polarizing plate disposed on the first organic film,
wherein an end of the polarizing plate is spaced inward or protrudes outward from an end of a side surface of the glass substrate by a predetermined separation distance, and
wherein the polarizing plate and the glass substrate form a stepped portion on a side surface of the display panel.

4. The display panel of claim 1, further comprising:
a touch sensor layer formed on the encapsulation layer; and
a color filter layer formed on the touch sensor layer,
wherein the first organic film covers a conductor interconnection pattern of the touch sensor layer or covers a color filter and a black matrix pattern of the color filter layer.

5. The display panel of claim 1, further comprising one or more dam patterns protruding from the glass substrate in an area between an end of the circuit layer and a side surface of the display panel.

6. The display panel of claim 1, wherein the glass substrate has a tapered surface positioned in the bezel region of the display panel.

7. The display panel of claim 6, wherein a thickness of glass decreases from the tapered surface of the glass substrate toward a side surface of the display panel.

8. The display panel of claim 1, further comprising a second organic film for glass protection disposed on a rear surface of the glass substrate,
wherein the circuit layer, the light-emitting element layer, the encapsulation layer, and the first organic film are stacked on a front surface of the glass substrate.

9. The display panel of claim 8, wherein the second organic film for glass protection is in contact with the first organic film on a side surface of the display panel, and an side surface of the extended portion of the inorganic film is surrounded by the second organic film for glass protection and the first organic film.

10. A display panel comprising:
a glass substrate;
a circuit layer disposed on the glass substrate;
a light-emitting element layer disposed on the circuit layer;
an encapsulation layer covering the light-emitting element layer; and
a first organic film covering the encapsulation layer,
wherein, at a side surface of the display panel exposed to an outside, a residual inorganic film extending from the encapsulation layer is exposed to the outside, the residual inorganic film being thinner than the encapsulation layer, and
wherein a portion of the first organic film disposed on the residual inorganic film is exposed to the outside at the side surface of the display panel.

11. The display panel of claim 10, further comprising a conductor interconnection pattern formed on the encapsulation layer,
wherein the first organic film covers the conductor interconnection pattern.

12. The display panel of claim 11, further comprising a polarizing plate disposed on the first organic film,
wherein an end of the polarizing plate is spaced inward or protrudes outward from an end of a side surface of the glass substrate by a predetermined separation distance, and
wherein the polarizing plate and the glass substrate form a stepped portion on the side surface of the display panel.

13. The display panel of claim 10, further comprising:
a touch sensor layer formed on the encapsulation layer; and
a color filter layer formed on the touch sensor layer,
wherein the first organic film covers a conductor interconnection pattern of the touch sensor layer or covers a color filter and a black matrix pattern of the color filter layer.

14. The display panel of claim 10, further comprising a second organic film for glass protection disposed on a rear surface of the glass substrate,
wherein the circuit layer, the light-emitting element layer, the encapsulation layer, and the first organic film are stacked on a front surface of the glass substrate.

15. A display panel comprising:
a glass substrate;
a circuit layer disposed on the glass substrate;
a light-emitting element layer disposed on the circuit layer;
an encapsulation layer disposed on the light-emitting element layer; and
a first organic film disposed on the encapsulation layer,
wherein, at a side surface of the display panel exposed to an outside, a portion of the first organic film that extends from the encapsulation layer is exposed to the outside.

16. The display panel of claim 15, further comprising a conductor interconnection pattern formed on the encapsulation layer,
wherein the first organic film covers the conductor interconnection pattern.

17. The display panel of claim 16, further comprising a polarizing plate disposed on the first organic film,
wherein an end of the polarizing plate is spaced inward or protrudes outward from an end of a side surface of the glass substrate by a predetermined separation distance, and
wherein the polarizing plate and the glass substrate form a stepped portion on the side surface of the display panel.

18. The display panel of claim 15, further comprising:
a touch sensor layer formed on the encapsulation layer; and
a color filter layer formed on the touch sensor layer, wherein the first organic film covers a conductor interconnection pattern of the touch sensor layer or covers a color filter and a black matrix pattern of the color filter layer.

19. The display panel of claim 15, further comprising a second organic film for glass protection disposed on a rear surface of the glass substrate,
- wherein the circuit layer, the light-emitting element layer, the encapsulation layer, and the first organic film are stacked on a front surface of the glass substrate.

20. The display panel of claim 15, wherein the encapsulation layer and the portion of the first organic film are made of a same material,
- wherein a thickness of the portion of the first organic film is less than a thickness of encapsulation layer,
- wherein a thickness of other portions than the portion of the first organic film is greater than the thickness of the portion of the first organic film, and
- wherein the other portions than the portion of the first organic film are disposed directly on the portion of the first organic film in an area corresponding to the side surface of the display panel exposed to the outside.

* * * * *